United States Patent
Yin

(10) Patent No.: US 7,834,790 B1
(45) Date of Patent: Nov. 16, 2010

(54) COMMUNICATION DEVICE INCLUDING A POWER REDUCTION MECHANISM

(75) Inventor: Guangming Yin, Foothill Ranch, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 106 days.

(21) Appl. No.: 12/206,773

(22) Filed: Sep. 9, 2008

(51) Int. Cl.
*H03M 1/66* (2006.01)
(52) U.S. Cl. ..................................................... 341/144
(58) Field of Classification Search .................. 341/144
See application file for complete search history.

(56) References Cited

U.S. PATENT DOCUMENTS

| | | | |
|---|---|---|---|
| 6,154,092 A * | 11/2000 | Lee et al. ..................... 341/144 |
| 7,068,200 B1 * | 6/2006 | Hodapp et al. ............... 341/144 |
| 2005/0258991 A1 * | 11/2005 | Efland et al. ................. 341/144 |
| 2008/0253356 A1 * | 10/2008 | Berman et al. .............. 370/352 |
| 2009/0190513 A1 * | 7/2009 | Islam et al. .................. 370/311 |

* cited by examiner

*Primary Examiner*—Howard Williams
(74) *Attorney, Agent, or Firm*—Meyertons, Hood, Kivlin, Kowert & Goetzel, P.C.; Stephen J. Curran

(57) ABSTRACT

A communication device includes a communication port that includes a digital to analog converter (DAC) that may be configured to output for transmission an analog signal that corresponds to a digital input such as link data that is to be transmitted on a physical link. The communication port further includes a control unit coupled to the DAC and may be configured to provide a bias current to the DAC during operation. In addition, the control unit may further be configured to reduce the bias current to the DAC dependent upon a mode of operation of the communication port and whether there is data to transmit.

20 Claims, 3 Drawing Sheets

COMMUNICATION DEVICE INCLUDING A POWER REDUCTION MECHANISM

BACKGROUND OF THE INVENTION

1. Field of the Invention

This invention relates to reducing power consumption and, more particularly, to power reduction in a communication interface.

2. Description of the Related Art

In today's computing and communications environments, power consumption is fast becoming of paramount importance. This may be particularly true for portable devices that use batteries. Power management systems are utilized in many systems in an effort to reduce the power consumed by devices. However, as demand increases for increased battery life and lower power consumption devices, further improvements in power reduction may be necessary.

SUMMARY

Various embodiments of a communication device including a power reduction mechanism are disclosed. In one embodiment, the communication device includes a communication port such as an Ethernet port, for example. The communication port may include a digital to analog converter (DAC) that may be configured to output for transmission an analog signal that corresponds to a digital input. For example, the digital input may be link data that is to be transmitted on a physical Ethernet link. The communication port further includes a control unit coupled to the DAC and may be configured to provide a bias current to the DAC during operation. In addition, the control unit may further be configured to reduce the bias current to the DAC dependent upon a mode of operation of the communication port and whether there is data to transmit.

For example, in one specific implementation, the control unit may ramp down the bias current to the DAC to a minimum current value between idle pulses transmitted by the DAC in response to determining that the communication port is in an idle mode of operation. Further, the control unit may ramp up the bias current to the DAC to a full-scale current value for a predetermined amount of time before the idle pulse is transmitted and to ramp down the bias current to the DAC to zero after the idle pulse has been transmitted.

In another embodiment, a method for operating a communication port includes a digital to analog converter (DAC) outputting for transmission an analog signal that corresponds to a digital input, such as digital link data for example. The method also includes a control unit providing a bias current to the DAC during operation. Further, the method may include the control unit reducing the bias current to the DAC dependent upon a mode of operation of the communication port and whether there is data to transmit.

Figure 1:
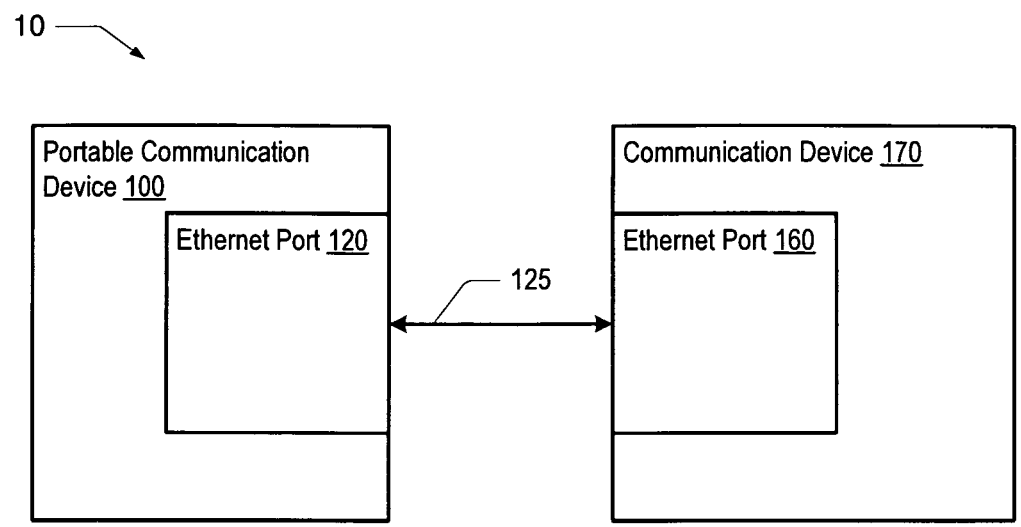
FIG. 1 is a block diagram of an embodiment of a system including a portable communication device.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. It is noted that the word "may" is used throughout this application in a permissive sense (i.e., having the potential to, being able to), not a mandatory sense (i.e., must).

DETAILED DESCRIPTION

Turning now to FIG. 1, a block diagram of an embodiment of communication system 10 including a portable communication device 100 is shown. The portable communication device 100 is coupled to a communication device 170 via a communication link 125. As shown, the portable communication device 100 includes an Ethernet port 120, and the communication device 170 also includes an Ethernet port 160. In one embodiment, the Ethernet ports 120 and 160 may support any of a variety of Ethernet protocols that conform to the IEEE 802.3 family of standards such as 10 megabits/sec baseband twisted pair (10 BT), 100 megabits/sec baseband twisted pair (100 BT), and 1000 megabits/sec baseband twisted pair (1000 BT), for example. As such, the communication link 125 may be a multi-wire twisted pair cable.

Figure 2:
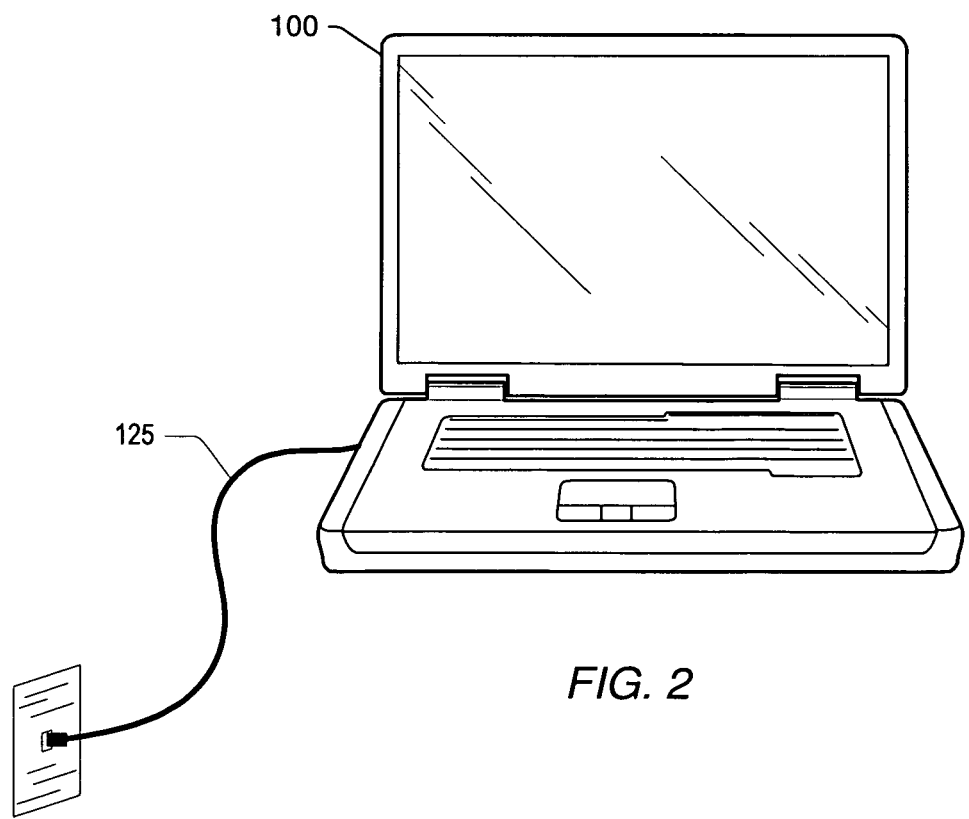
FIG. 2 is an illustration of an exemplary portable communication device.

In various embodiments, portable communication device 100 may be representative of any type of portable device that may include an Ethernet port 120. For example, as shown in FIG. 2, portable communication device 100 is depicted as a portable "laptop" or "notebook" computer. In one embodiment, the Ethernet port 120 may be implemented as an integrated circuit chip solution that may be provided as part of a chipset solution to, for example, motherboard manufacturers. In another embodiment, the Ethernet port 120 may be implemented as part of larger communication device solution having other communication functionality by integrating the Ethernet port 120 onto the die of the larger communication device solution.

As described above, during operation of portable devices it may be desirable to minimize battery drain. Accordingly, as described in greater detail below, the Ethernet port 120 includes functionality to reduce power consumption during certain modes of operation. For example, when operating as a 10 BT port, there may be times when the Ethernet link may be idle. During this idle time, Ethernet devices may transmit link pulses every 14 ms. Generally, these pulses may be only 200 ns wide. Thus comparatively, there is a significant amount of time between pulses that transmitter circuitry such as drivers, digital to analog converters and the like may be unnecessarily powered up. As such, it may be desirable to power various components down during these idle times. However, powering up a component quickly may, for example, cause unwanted electromagnetic interference (EMI) through spurious emissions, which could interfere with surrounding circuits.

Thus, in an effort to reduce such emissions, these components may be powered up and down relatively slowly using a ramping technique when appropriate. More particularly, as described further below in conjunction with the descriptions of FIG. 3 through FIG. 5, the current source that provides bias current to one or more components such as a digital to analog converter (DAC) may be ramped up when a link pulse may be transmitted and may be ramped down after the link pulse has been transmitted and while waiting for the next pulse.

Figure 3:
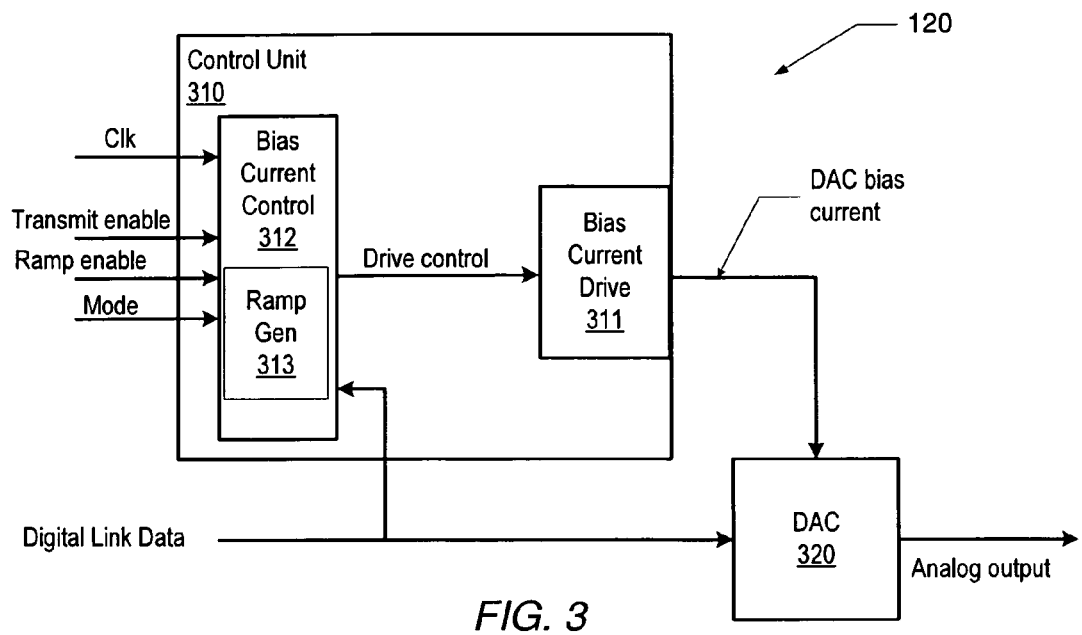
FIG. 3 is a more detailed block diagram of one embodiment of an Ethernet port of FIG. 1.

Referring to FIG. 3, a block diagram illustrating portions of one embodiment of the Ethernet port 120 of FIG. 1 is shown. Control unit 310 is coupled to a DAC 320. The DAC 320 is coupled to receive digital link data and to output an analog representation of the digital input. For example, the digital data from other parts of the portable communication device 100 may be converted to an analog signal and transmitted via transmitter driver circuits (not shown) in another portion of the Ethernet port 120. The control unit 310 is configured to provide the DAC bias current to DAC 320.

As shown, the control unit 310 includes a bias current control unit 312 that is coupled to a bias current drive unit 311. In the illustrated embodiment, the bias current control unit 312 includes a ramp generation unit 313. The control unit 310 is coupled to receive a number of control signals including a clock signal (Clk), a Transmit enable signal, a Ramp enable signal, and a Mode signal. In one embodiment, the Transmit enable signal may indicate that transmit data (e.g., digital communication data) is ready to be transmitted. The Ramp enable signal may indicate when the bias current ramp should begin before a link pulse is transmitted and end after the link pulse is transmitted, as described in greater detail below. The Mode signal may indicate a mode of operation of the Ethernet port 120. Further, although the Mode signal is shown as a single signal, it is contemplated that it may include a number of signals that may encode the operational mode of the Ethernet port 120. For example, as mentioned above, the Ethernet port may support a number of Ethernet protocols. As such, the mode signal may provide encodings for each mode, including an idle mode. The control unit input signals may be provided by other circuits in other parts of the Ethernet port 120, or within the portable communication device 100. The bias current control unit 312 is configured to provide ramp drive signals to the bias current drive unit 311.

In one embodiment, the bias current control unit 312 may be configured to determine the mode Ethernet port 120 is operating, and to generate and provide drive control signals for use by the bias current drive unit 311 to ramp up and/or down the DAC bias current, and in certain cases to bypass the ramping functionality and to provide a full bias current to the DAC 320.

Figure 4:
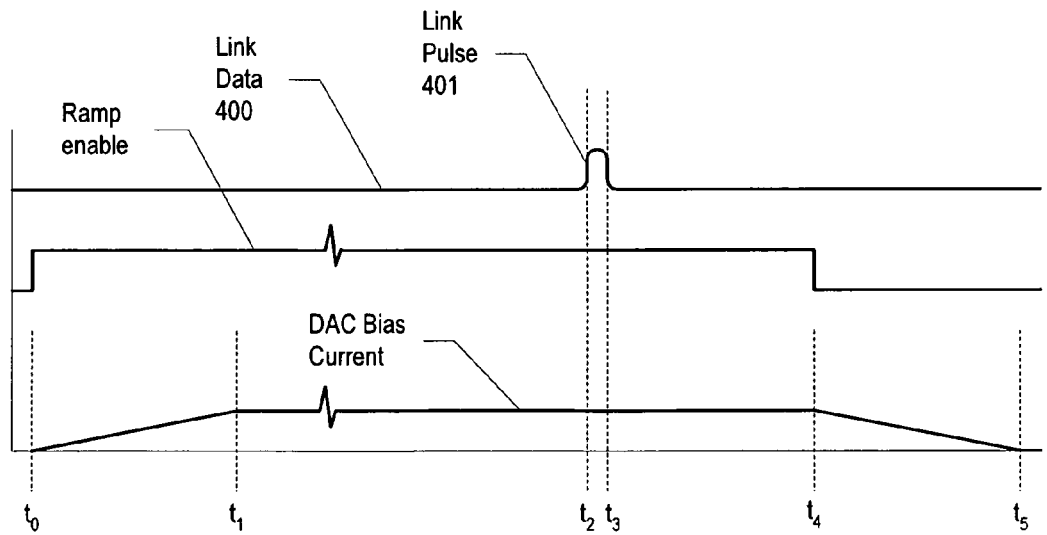
FIG. 4 is a timing diagram illustrating timing aspects of the ramp up and ramp down sequences of the bias current supplied to circuits within the embodiment of the Ethernet port of FIG. 1 and FIG. 3.

In one embodiment, the bias current drive unit 311 may include one or more parallel current sources (not shown) and a plurality of switches (not shown) that couple the parallel current sources to the output of the current drive unit 311. Accordingly, during a ramp up of the bias current, the switches may be sequentially closed to provide an increasingly additive current (in parallel) until all switches are closed, thereby providing full bias current. Similarly, when ramping down the bias current, the switches may be sequentially opened to reduce the bias current. In another embodiment, the switches may be operable to independently enable and disable parallel current sources and thereby determine the amount of bias current. In one embodiment, the drive control signals may include one or more signals that activate the switches. In addition, the drive control signals may include a separate Transmit enable signal that may allow the bias current drive unit 311 to provide full bias current immediately and to bypass ramping. Further, in one embodiment, the bias current drive unit 311 may ramp the DAC bias current up and down at predetermined times as shown in FIG. 4. In one embodiment, bias current control unit 312 may generate the drive control signals using various circuits such as timers, registers, and the like.

Referring briefly to FIG. 4, a timing diagram illustrating timing aspects of the ramp up and ramp down sequences of the bias current drive unit 311 of FIG. 3 is shown. As describe above, when the Ethernet port 120 is in an idle mode, link pulses may be transmitted every 14 ms as may be required by one or more Ethernet protocols. As shown in FIG. 4, a link pulse 401 is shown being transmitted beginning at time t2 and ending at time t3. In one embodiment, the pulse width of the link pulse may be 200 ns.

As mentioned above, at a predetermined time after a link pulse is sent, the DAC bias current may be ramped down to advantageously reduce power consumption. Accordingly, at time t4, the DAC bias current is beginning to ramp down to zero. It is noted that in one embodiment, the duration from t3 to t4 may be 2 us, and the duration of the ramp between t4 and t5 may also be 2 us. In one embodiment, as long as the Ethernet port 120 stays in the idle mode, the DAC bias current may remain at zero. At a predetermined point (e.g., at the rising edge of the Ramp enable signal) before the next link pulse needs to be sent, the DAC bias current may be ramped up as shown at time t0. As shown the bias current may ramp until full current is reached at time t1. The current drive may remain at full current until after the link pulse is sent as shown from time t2 to time t4. In one embodiment, the ramp up duration may be 2 us, while the duration of the full current on to link pulse start may be 8 us. Thus, as can be seen from the DAC bias current shown in FIG. 4, from the time the ramp up begins until the ramp down begins may be referred to as an idle drive window. In this embodiment, the drive window starts at time t0 and ends at time t4, and has a duration of 12.2 us, and may be determined by the rising and falling edges of the Ramp enable signal. Note that the durations may be implementation dependent and it is contemplated that in other embodiments the duration of the various segments may be different.

Figure 5:
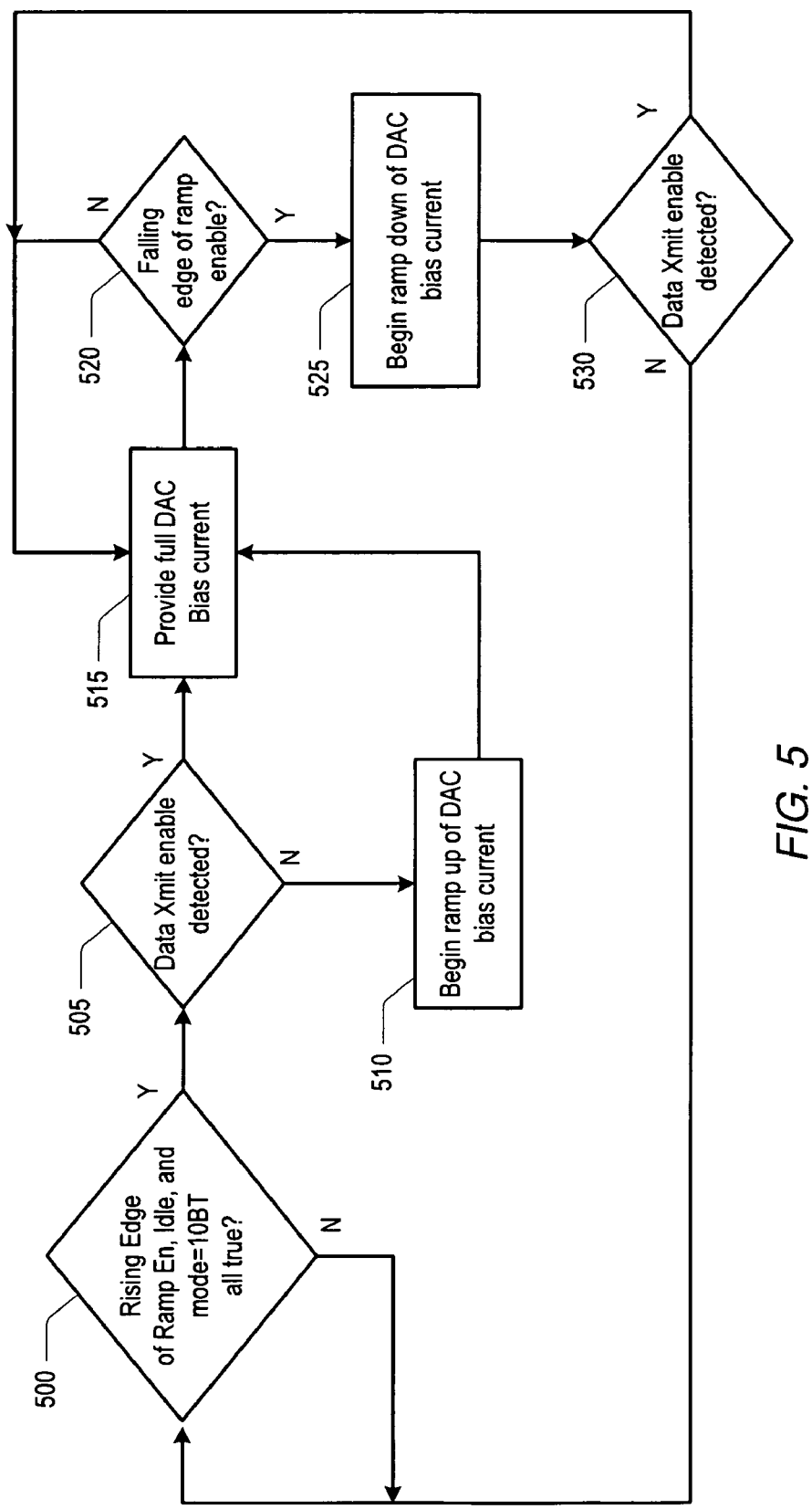
FIG. 5 is a flow diagram describing the operation of one embodiment of the Ethernet port shown in FIG. 1 and FIG. 3.

Turning to FIG. 5, a flow diagram describing the operation of the embodiments shown in FIG. 1 and FIG. 3 is shown. Referring collectively to FIG. 1, FIG. 3 and FIG. 4 and beginning in block 500 of FIG. 5 control unit 310 determines in what mode the Ethernet port 120 is operating, and whether a link pulse is to be transmitted. In one embodiment, based upon the received control signals described above, control unit 310 may determine if the Ethernet port 120 is in 10 BT idle mode, with link pulse data, and whether the rising edge of the Ramp enable has been received. If not, bias current control unit 312 may continue operation in the current state. If however, the bias current control unit 312 detects the Ramp enable signal when in the 10 BT idle mode, the bias current control unit 312 may check for any transmit data by checking the Transmit enable signal (block 505). If there is transmit data ready to be transmitted, (e.g., the bias current drive unit 311 detects the Transmit enable signal being asserted) bias current control unit 312 may provide the drive control signals to cause the bias current drive unit 311 to provide full DAC bias current to DAC 320 (block 515). For example, in one embodiment, the bias current control unit 312 may provide a signal that may substantially simultaneously close all DAC bias current source switches, thereby providing full DAC bias current.

Referring back to block 505, if there is no transmit data ready to be transmitted (e.g., the Transmit enable signal is deasserted), the ramp generation unit 313 may provide the drive control signals necessary to allow the bias current drive unit 311 to begin ramping up the DAC bias current (block 510). In response, the bias current drive unit 311 may ramp the drive current to full DAC bias current (block 515). For example, as described above in one embodiment, the ramp generation unit 313 may provide drive control signals that sequentially close the various DAC bias current source switches, which may incrementally increase the DAC bias current.

Note that, in one embodiment, the Transmit enable signal may transition at any time, since transmit data may need to be transmitted. Accordingly, during the ramp up of the bias current, if the bias current control unit 312 detects the Transmit enable signal being asserted, the bias current control unit 312 may responsively bypass the ramping operation and provide the necessary drive control signals to cause the bias current drive unit 311 to provide full DAC bias current to DAC 320.

The bias current drive unit 311 may continue to provide full bias current until the falling edge of the Ramp enable signal is detected (block 520). Accordingly, when falling edge is detected, the ramp generation unit 313 may provide the drive control signals necessary to allow the bias current drive unit 311 to begin ramping down the DAC bias current (block 525).

As noted above, the Transmit enable signal may transition at any time. Accordingly, if the bias current control unit 312 detects the Transmit enable signal being asserted (block 530), the bias current control unit 312 may responsively bypass the ramp down operation and provide the necessary drive control signals to cause the bias current drive unit 311 to provide full DAC bias current to DAC 320, as described above in block 515. The bias current control unit 312 may continue to provide the necessary drive control signals to cause the bias current drive unit 311 to provide full DAC bias current to DAC 320 until the Transmit enable signal is deasserted. Operation may then proceed as described above in conjunction with block 500.

Note that in the event that the Transmit enable signal is asserted during completely idle time (e.g., no link pulse and when the Ramp enable signal is not asserted), the bias current control unit 312 may responsively provide the necessary drive control signals to cause the bias current drive unit 311 to provide full DAC bias current to DAC 320.

The control unit 310 may continually monitor the received Mode signals to determine if a mode change occurred or whether data needs to be transmitted. If the mode has changed the bias current control unit 312 may is configured to cause the DAC bias current to go to full current substantially immediately.

Note that, regardless of whether the DAC bias current is ramping up or ramping down, if a mode change is detected or if data is ready to transmit, the bias current control unit 312 may cause the current to go to a substantially full current value. In addition, in one embodiment, since the digital data input to the DAC 320 during idle mode may be substantially zeros, a sudden increase in current may not perturb the analog output line substantially.

It is further noted that the operation depicted in FIG. 5 is merely one way of depicting the operation of one embodiment. It is contemplated that in other embodiments the operation of certain events may occur in a different order than that shown.

Lastly, although the embodiments above have been described in the context of a portable communication device, it is contemplated that the embodiments may be used in any communication device to reduce the power consumed by the device.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A communication device comprising:
a communication port including:
a digital to analog converter (DAC) configured to output for transmission an analog signal that corresponds to a digital input; and
a control unit coupled to the DAC and configured to provide a bias current to the DAC during operation;
wherein the control unit is further configured to ramp the bias current to the DAC by sequentially reducing the bias current, and sequentially increasing the bias current dependent upon a mode of operation of the communication port and whether there is data to transmit.

2. The device as recited in claim 1, wherein the control unit is further configured to ramp down the bias current to the DAC to a minimum current value between link pulses transmitted by the DAC in response to determining the communication port is in an idle mode of operation.

3. The device as recited in claim 2, wherein the control unit is further configured to ramp up the bias current to the DAC to a full scale current value for a predetermined amount of time before each link pulse is transmitted and to ramp down the bias current to the DAC to zero after the link pulse has been transmitted.

4. The device as recited in claim 1, wherein the control unit comprises a current drive unit including a current source configured to provide the bias current to the DAC, wherein the current source includes a plurality of independently controllable current sources coupled in parallel.

5. The device as recited in claim 4, wherein the control unit further comprises a ramp generator unit coupled to the current drive unit and configured to determine the mode of operation for the communication port based upon a plurality of input signals and to generate corresponding control signals for use by the current drive unit to ramp the bias current to the DAC up and down.

6. The device as recited in claim 5, wherein the ramp generator unit is configured to provide signals that sequentially enable each of the plurality of independently controllable current sources during the ramp up, and to provide signals that sequentially disable each of the plurality of independently controllable current sources during the ramp down of the bias current to the DAC.

7. The device as recited in claim 5, wherein the ramp generator unit is configured to bypass the ramping up and ramping down of the bias current to the DAC, and to cause the bias current to increase to a full current value in response to either determining there is data to transmit, or in response to determining the mode of operation has changed.

8. The device as recited in claim 1, wherein in response to determining the communication port is in an idle mode of operation, the control unit is further configured to incrementally decrease the bias current to the DAC from a full scale current value to a minimum current value over a predetermined non-zero time interval.

9. The device as recited in claim 2, wherein the control unit is further configured to incrementally increase the bias current to the DAC from the minimum current value to a full scale current value for a predetermined amount of time in response to determining that a link pulse is ready for transmission, and to incrementally decrease the bias current to the DAC to the minimum current value after the link pulse has been transmitted.

10. The device as recited in claim 1, wherein the control unit comprises a current drive unit including a current source configured to provide the bias current to the DAC, wherein the current source includes a plurality of independently controllable current sources, wherein the output of each of the independently controllable current sources is coupled in parallel.

11. The device as recited in claim 10, wherein the control unit further comprises a ramp generator unit that is coupled to the current drive unit and configured to determine the mode of operation for the communication port based upon one or more input signals, and to provide control signals that sequentially enable each of the plurality of independently controllable current sources during the increasing of the bias current, and to provide signals that sequentially disable each of the plurality of independently controllable current sources during the decreasing of the bias current.

12. The device as recited in claim 11, wherein the ramp generator unit is configured to provide control signals to the current drive unit to cause the bias current to substantially immediately increase to a full current value in response to determining there is data to transmit, and in response to determining an operational mode has changed irrespective of whether the current drive unit is increasing or decreasing the bias current.

13. A method for operating a communication port, the method comprising:
    a digital to analog converter (DAC) outputting for transmission an analog signal that corresponds to a digital input;
    a control unit providing a bias current to the DAC during operation; and
    the control unit ramping the bias current to the DAC by sequentially decreasing and increasing the bias current dependent upon a mode of operation of the communication port and whether there is data to transmit.

14. The method as recited in claim 13, further comprising the control unit ramping down the bias current to the DAC to a minimum current value between idle pulses transmitted by the DAC in response to determining the communication port is in an idle mode of operation.

15. The method as recited in claim 14, further comprising the control unit ramping up the bias current to the DAC to a full scale current value for a predetermined amount of time before a link pulse is transmitted and to ramp down the bias current to the DAC to zero after the link pulse has been transmitted.

16. The method as recited in claim 13, further comprising the control unit providing the bias current to the DAC using a current source including a plurality of independently controllable current sources coupled in parallel.

17. The method as recited in claim 16, further comprising the control unit determining a mode of operation for the communication port and generating corresponding control signals for use by the current drive unit to ramp the bias current to the DAC up and down using a ramp generator unit.

18. The method as recited in claim 17, further comprising the ramp generator unit providing control signals that sequentially enable each of the plurality of independently controllable current sources during the ramp up, and providing signals that sequentially disable each of the plurality of independently controllable current sources during the ramp down of the bias current to the DAC.

19. The method as recited in claim 17, further comprising the ramp generator unit bypassing the ramping up and ramping down of the bias current to the DAC, and providing control signals to cause the bias current to increase to a full current value in response to either determining there is data to transmit, or in response to determining the mode of operation has changed.

20. A communication device comprising:
    a communication port including:
        a digital to analog converter (DAC) configured to output for transmission an analog signal that corresponds to a digital link data input;
        a control unit coupled to the DAC and configured to provide a bias current to the DAC during operation;
        wherein the control unit is further configured to sequentially increase and sequentially decrease the bias current to the DAC dependent upon a mode of operation of the communication port.

* * * * *